(12) United States Patent
Franklin et al.

(10) Patent No.: US 10,306,784 B2
(45) Date of Patent: *May 28, 2019

(54) NOTCHED DISPLAY LAYERS

(71) Applicant: Apple Inc., Cupertino, CA (US)

(72) Inventors: Jeremy C. Franklin, San Francisco, CA (US); Benjamin M. Rappoport, Los Gatos, CA (US); John P. Ternus, Los Altos Hills, CA (US); Sean Corbin, San Jose, CA (US); Stephen R. McClure, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/859,118

(22) Filed: Dec. 29, 2017

(65) Prior Publication Data

US 2018/0124934 A1 May 3, 2018

Related U.S. Application Data

(63) Continuation of application No. 13/490,287, filed on Jun. 6, 2012, now Pat. No. 9,894,781.

(51) Int. Cl.
*G02F 1/1333* (2006.01)
*G02F 1/1345* (2006.01)
(Continued)

(52) U.S. Cl.
CPC ....... *H05K 5/0017* (2013.01); *G02F 1/13452* (2013.01); *G02F 1/133308* (2013.01);
(Continued)

(58) Field of Classification Search
None
See application file for complete search history.

(56) References Cited

U.S. PATENT DOCUMENTS

| 3,964,157 A | 6/1976 | Kuhn et al. |
| 5,801,919 A | 9/1998 | Griencewic |

(Continued)

FOREIGN PATENT DOCUMENTS

| CN | 101013707 | 8/2007 |
| CN | 101183200 | 5/2008 |

(Continued)

*Primary Examiner* — Edward J Glick
*Assistant Examiner* — Anthony G Quash
(74) *Attorney, Agent, or Firm* — Treyz Law Group, P.C.; G. Victor Treyz; Kendall W. Abbasi

(57) ABSTRACT

An electronic device may have a display mounted in a housing. The display may have layers such as polarizer layers, a color filter layer, and a thin-film transistor layer. Display layers such as color filter layers and thin-film-transistor layers may have glass substrates. Notches or other openings may be formed in the layers of a display. For example, a notch with a curved chamfered edge may be formed in a lower end of a thin-film-transistor layer. A component such as a button may overlap the notch. Structures such as sensors, cameras, acoustic components, and other electronic components, buttons, communications path structures such as flexible printed circuit cables and wire bonding wires, and housing structures may be received within a display layer notch.

24 Claims, 17 Drawing Sheets

(51) Int. Cl.
   *H05K 5/00*     (2006.01)
   *G06F 1/16*     (2006.01)
   *H01L 29/786*   (2006.01)
   *H05K 1/02*     (2006.01)
   *H04M 1/02*     (2006.01)
   *H04M 1/23*     (2006.01)

(52) U.S. Cl.
   CPC .......... *G06F 1/1605* (2013.01); *G06F 1/1633* (2013.01); *G06F 1/1637* (2013.01); *G06F 1/1643* (2013.01); *H01L 29/786* (2013.01); *H04M 1/0266* (2013.01); *H05K 1/028* (2013.01); *G02F 1/13454* (2013.01); *G02F 2001/133322* (2013.01); *G02F 2201/42* (2013.01); *H04M 1/23* (2013.01)

(56) References Cited

U.S. PATENT DOCUMENTS

| | | | |
|---|---|---|---|
| 6,433,791 B2 | 8/2002 | Selli et al. | |
| 6,812,958 B1 | 11/2004 | Silvester | |
| 8,049,221 B2 | 11/2011 | Komori | |
| 9,894,781 B2* | 2/2018 | Franklin | H05K 5/0017 |
| 2005/0276009 A1 | 12/2005 | Kim | |
| 2008/0117367 A1 | 5/2008 | Abe | |
| 2009/0194572 A1 | 8/2009 | Miyashita et al. | |
| 2009/0272639 A1 | 11/2009 | Mittleman et al. | |
| 2010/0315570 A1* | 12/2010 | Mathew | G06F 1/1637 349/58 |
| 2011/0103041 A1 | 5/2011 | Mathew et al. | |
| 2011/0255259 A1 | 10/2011 | Weber et al. | |
| 2012/0020002 A1 | 1/2012 | Mathew et al. | |
| 2012/0069241 A1 | 3/2012 | Shiau et al. | |
| 2012/0105400 A1* | 5/2012 | Mathew | H04N 5/2251 345/207 |
| 2012/0314354 A1 | 12/2012 | Rayner | |
| 2013/0088671 A1 | 4/2013 | Drzaic et al. | |
| 2017/0117336 A1* | 4/2017 | Rappoport | H01L 27/3227 |

FOREIGN PATENT DOCUMENTS

| | | |
|---|---|---|
| EP | 2448243 | 5/2012 |
| JP | H01138535 | 5/1989 |
| JP | 2002328623 | 11/2002 |
| JP | 2007233349 | 9/2007 |
| TW | 548479 | 8/2003 |
| TW | 200947087 | 11/2009 |

* cited by examiner

NOTCHED DISPLAY LAYERS

This application is a continuation of U.S. patent application Ser. No. 13/490,287, filed Jun. 6, 2012, which is hereby incorporated by reference herein in its entirety. This application claims the benefit of and claims priority to U.S. patent application Ser. No. 13/490,287, filed Jun. 6, 2012.

BACKGROUND

This relates generally to electronic devices and, more particularly, to displays for electronic devices.

Electronic devices such as computers and cellular telephones have displays. It may sometimes be desirable to mount a display in a compact device housing. When forming a compact device in this way, it can be challenging to provide sufficient space within a housing to accommodate both display components and other components such as buttons. If care is not taken, these components may interfere with each other or may consume more volume than desired within a device.

It would therefore be desirable to be able to provide improved configurations for forming displays and other components in an electronic device.

SUMMARY

An electronic device may have a display mounted in a housing. The display may have display layers such as polarizer layers, a color filter layer, and a thin-film transistor layer. Display layers such as color filter layers and thin-film-transistor layers may have glass substrates. Notches or other openings may be formed in the layers of a display. For example, a notch with a curved shape may be machined along a lower edge of a thin-film-transistor layer.

An electronic device may have a component such as a button that overlaps at least partly with the notch, allowing the layout of the device to be optimized. The button may have a button member that reciprocates within an opening in a display cover layer. When subjected to an over-travel condition, the button member may contact a metal chassis portion of the display, rather than striking a thin-film transistor layer.

Notches and other openings may be formed in one or more of the display layers of the display. A notch may, for example, extend through multiple layers such as a color filter layer and a thin-film-transistor layer. Structures such as sensors, cameras, acoustic components, buttons, and other electronic components, communications path structures such as flexible printed circuit cables and wire bonding wires, and housing structures may be received within a display layer notch.

Further features of the invention, its nature and various advantages will be more apparent from the accompanying drawings and the following detailed description of the preferred embodiments.

DETAILED DESCRIPTION

Electronic devices that contain displays may also contain buttons and other components. To accommodate buttons and other components in a compact device housing, display layers may be provided with openings. These openings may be formed from holes or may be formed from notches or other recessed portions. Openings may be formed in layers such as a thin-film transistor layer in a liquid crystal display or other display substrates. Illustrative configurations in which display layers such as thin-film transistor layers are provided with notches are sometimes described herein as an example. This is merely illustrative. Any suitable layers within a display may be provided with recessed portions or other openings to accommodate device structures such as buttons and other components.

Figure 1:
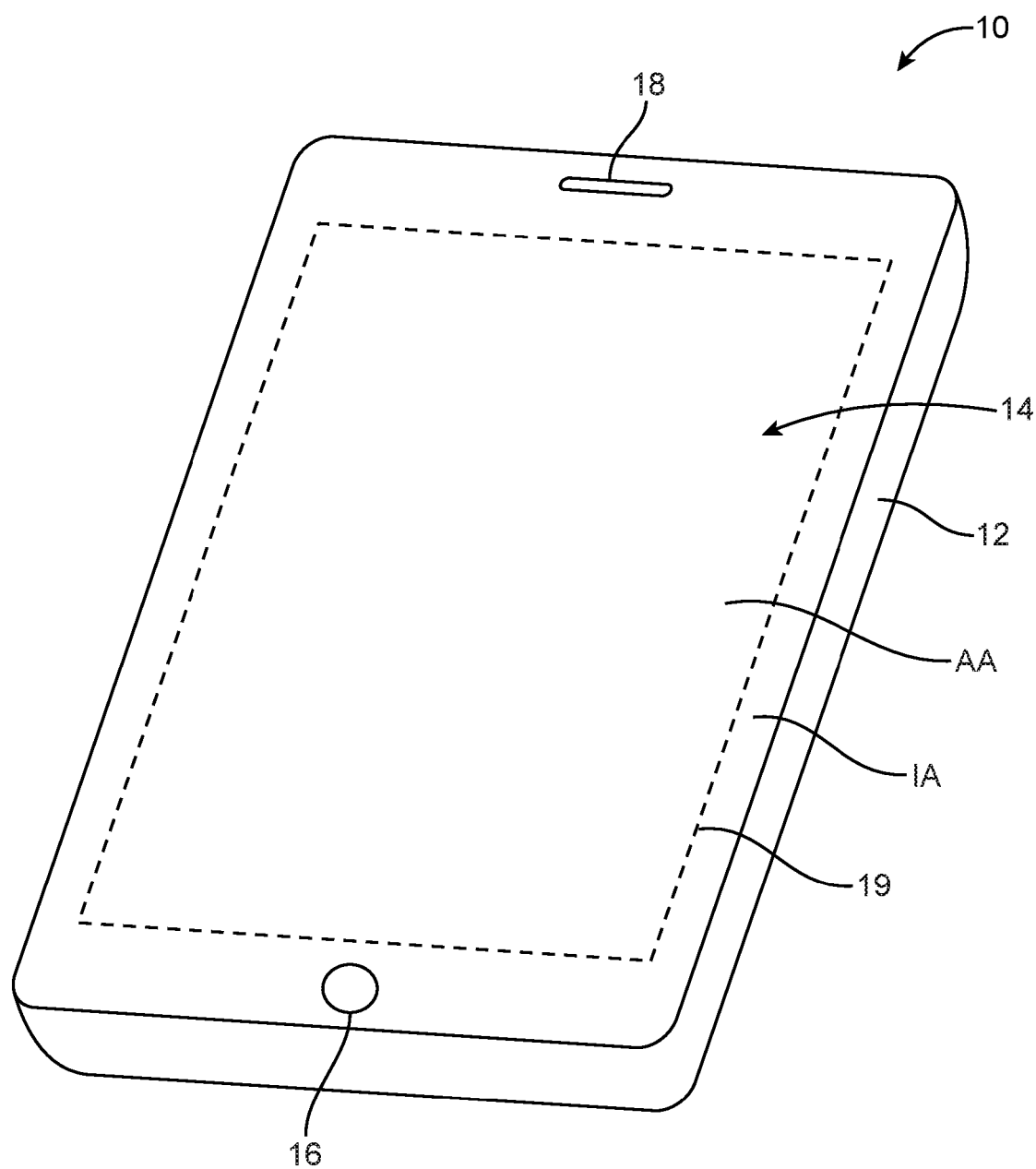
FIG. 1 is a perspective view of an illustrative electronic device with display structures in accordance with an embodiment of the present invention.

An illustrative electronic device of the type that may be provided with a notched display layer is shown in FIG. 1. Electronic device 10 may be a computer such as a computer that is integrated into a display, a laptop computer, a tablet computer, a somewhat smaller portable device such as a wrist-watch device, pendant device, or other wearable or miniature device, a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. Configurations in which display 14 includes liquid crystal display (LCD) components may sometimes be described herein as an example. This is, however, merely illustrative. Display 14 may include display pixels formed using any suitable type of display technology.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Display 14 may be characterized by an active region such as rectangular active region AA and an inactive region such as peripheral inactive region IA. Rectangular active region AA may be bounded by rectangular border 19. Inactive region IA may have the shape of a rectangular ring that surrounds the periphery of active region AA. If desired, some of the edges of display 14 may be borderless (i.e., the width of the inactive region on one or more edges may be zero or may be negligibly small). The illustrative configuration of FIG. 1 in which display 14 is surrounded by an inactive border region is merely illustrative.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.). The periphery of housing 12 may have a peripheral conductive member such as a metal housing sidewall member that runs around some or all of the periphery of device 10 or a display bezel that surrounds display 14. Structures such as these may also be formed from dielectric materials. The rear of housing 12 may be formed from a planar metal member or a dielectric structure. Sidewalls may be formed as integral portions of the rear housing surface or may be formed using separate structures (e.g., a separate metal housing band or display bezel). One or more openings may be formed in housing 12 to accommodate connector ports, buttons, and other components.

Figure 2:
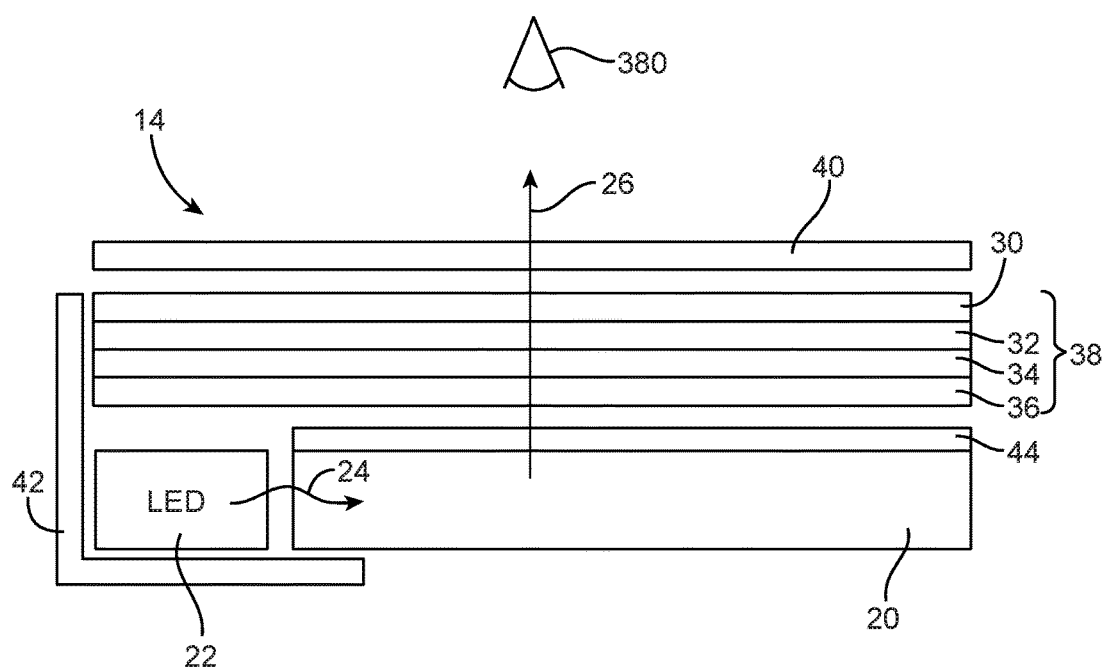
FIG. 2 is a cross-sectional side view of illustrative electronic device display structures in accordance with an embodiment of the present invention.

A cross-sectional side view of electronic device structures associated with display 14 is shown in FIG. 2. As shown in FIG. 2, display 14 may include display backlight structures 20, display structures 38, and optional touch sensor layer 40. Touch sensor layer 40 may be formed from an array of transparent conductive capacitive touch sensor electrodes such as indium tin oxide electrodes. A display cover layer such as a layer of glass or plastic may be used to cover the surface of display 14 (e.g., the front face of device 10 of FIG. 1). The conductive structures of touch sensor layer 40 may be formed on the cover layer, may be formed on a touch sensor substrate such as a layer of glass or plastic, or may be formed on other layers of display 14. If desired, display 14 may be insensitive to touch (i.e., touch sensor layer 40 may be omitted) or display 14 may include a touch sensor array based on other touch technologies (e.g., acoustic touch technology, optical touch technology, force-sensor-based touch technology, resistive touch technology, etc.).

Display backlight structures 20 may include a light guide plate, a reflector, and optical films. The light guide plate may be formed from a rectangular planar layer of plastic. Light 24 that is emitted from light-emitting diode array 22 may be coupled into the light guide plate through the edge of the light guide plate. Light 24 may be distributed laterally throughout display 14 due to the principal of total internal reflection. Light such as light 26 that scatters vertically upwards through backlight structures 20 may pass through display layers 38 (and touch sensor array layer 40) and may serve as backlight that helps a user such as user 380 to view images on display 14. The reflector in backlight structures 20 may be located below the light guide plate and may be used to direct light that has escaped from the light guide plate in the downwards direction back up in upwards direction 26, thereby enhancing backlight efficiency. Optical films such as brightness enhancing films, diffusing films, and other films may be included in backlight structures 20 (e.g., above the light guide plate), if desired.

Display structures 38 may include liquid crystal display structures or structures associated with other suitable types of display. In an illustrative liquid crystal display configuration, a layer of liquid crystal material may be sandwiched between color filter layer 32 and thin-film transistor layer 34.

Layer 32 may contain an array of color filter elements for providing display 14 with the ability to display color images for viewer 380. Layer 34 may contain an array of display pixels electrodes. The display pixel electrodes may be used to impose electric fields on portions of the liquid crystal layer, thereby creating an image on display 14. Thin-film transistor circuitry on layer 34 may be used to route control signals from a display driver circuit (e.g., a display driver integrated circuit) to display pixel thin-film transistors and electrodes on layer 34.

Display layers 38 may be formed from clear substrates such as layers of clear glass, layers of clear plastic, etc. For example, color filter layer 32 may be formed from a transparent glass substrate layer that has been provided with an array of colored polymer color filter elements. Thin-film transistor layer 34 may be formed from a transparent glass substrate layer that has been covered with circuitry such as polysilicon thin-film transistor circuitry and/or amorphous silicon transistor circuitry that forms display circuitry such as gate line driver circuitry, pixel electrodes, etc. Layers 32 and 34 (e.g., layers formed from glass substrates) may be sandwiched between upper polarizer layer 30 and lower polarizer layer 36. If desired, layers 32 and 34 may be formed from clear polymer substrates (e.g., sheets of polyimide or other transparent polymers). Polarizer layers 30 and 36 may be formed from polymer substrates or other suitable substrates. Configurations in which layers 32 and 34 are formed from glass substrates are sometimes described herein as an example).

One or more chassis structures such as chassis structures 42 may be used in forming display 14. Chassis structures 42 may include a plastic chassis structure (sometimes referred to as a p-chassis) and/or a metal chassis structure (sometimes referred to as an m-chassis). These chassis structures may be used in supporting the structures of display 14 such as backlight light source 22, backlight structures 20, and other display layers such as display layers 38. In the diagram of FIG. 2, chassis structures 42 are shown as having an L-shaped cross-sectional shape. This is merely illustrative. In general, structures 42 may have an L-shaped cross-sectional shape, a C-shaped cross-sectional shape, or other cross-sectional shapes. As an example, a metal chassis portion of structures 42 may have a C-shaped cross-sectional shape that wraps around one of the ends of display layers 38 (e.g., a lower end).

Display layers 38 may have rectangular outlines or outlines of other suitable shapes (e.g., outlines with straight edges, outlines with curved edges, outlines with combinations of straight and curved edges, etc.). The use of rectangular shapes such as elongated rectangular shapes may allow display layers 38 to be used in forming a rectangular active area (i.e., active area AA) for display 14.

It may sometimes be desirable to use rectangular layers 38 for display 14 that have different sizes. For example, it may be desirable to use a color filter layer that is smaller than an associated thin-film transistor layer. The use of the smaller color filter layer may create a recessed area at the end of display 14 that exposes an end portion of the thin-film transistor layer. Components such as display driver integrated circuits (display driver circuitry) may be mounted on the exposed end portion of the thin-film transistor layer, so this portion of the thin-film transistor layer may sometimes be referred to as a thin-film transistor ledge. There may be one, two, three, four, or more display driver integrated circuits mounted on the thin-film-transistor ledge.

Conductive traces on the thin-film-transistor layer may be used to distribute display signals to circuitry on the thin-film transistor layer (e.g., display pixel circuits) from the display driver circuitry. A flexible printed circuit cable (e.g., a cable formed from conductive traces on a layer of polyimide or a sheet of other flexible polymer) may be coupled to the conductive traces on the thin-film-transistor layer. For example, a flexible printed circuit in the form of a cable may be used to route display signals from a printed circuit board to conductive traces on the thin-film transistor ledge.

Space is often at a premium in electronic devices. To ensure that devices can be implemented using compact structures, it may be desirable to form openings in one or more layers of a display. As an example, a recessed portion or a hole may be formed in one or more of display layers 38 to accommodate a device structure such as wires, a flex circuit cable, a screw or other fastener, internal housing structures, a camera or other electrical component, a connector housing, a button, or other device structures. The recessed portion in a display layer may, for example, form a notch in the ledge portion of a thin-film transistor layer.

A button or structures associated with a button may be received within a display layer notch. As an example, a button member, a support structure that is used in supporting a button switch, a button gasket, or other structures associated with a button or other component may be received within at least a portion of the notch in a thin-film transistor layer. Accommodating button structures or other structures within a thin-film-transistor layer notch in this way may allow a device to have an enhanced configuration. For example, use of a thin-film-transistor layer notch or other display layer opening may allow an electronic device to be implemented in a more compact configuration than would otherwise be possible.

Figure 3:
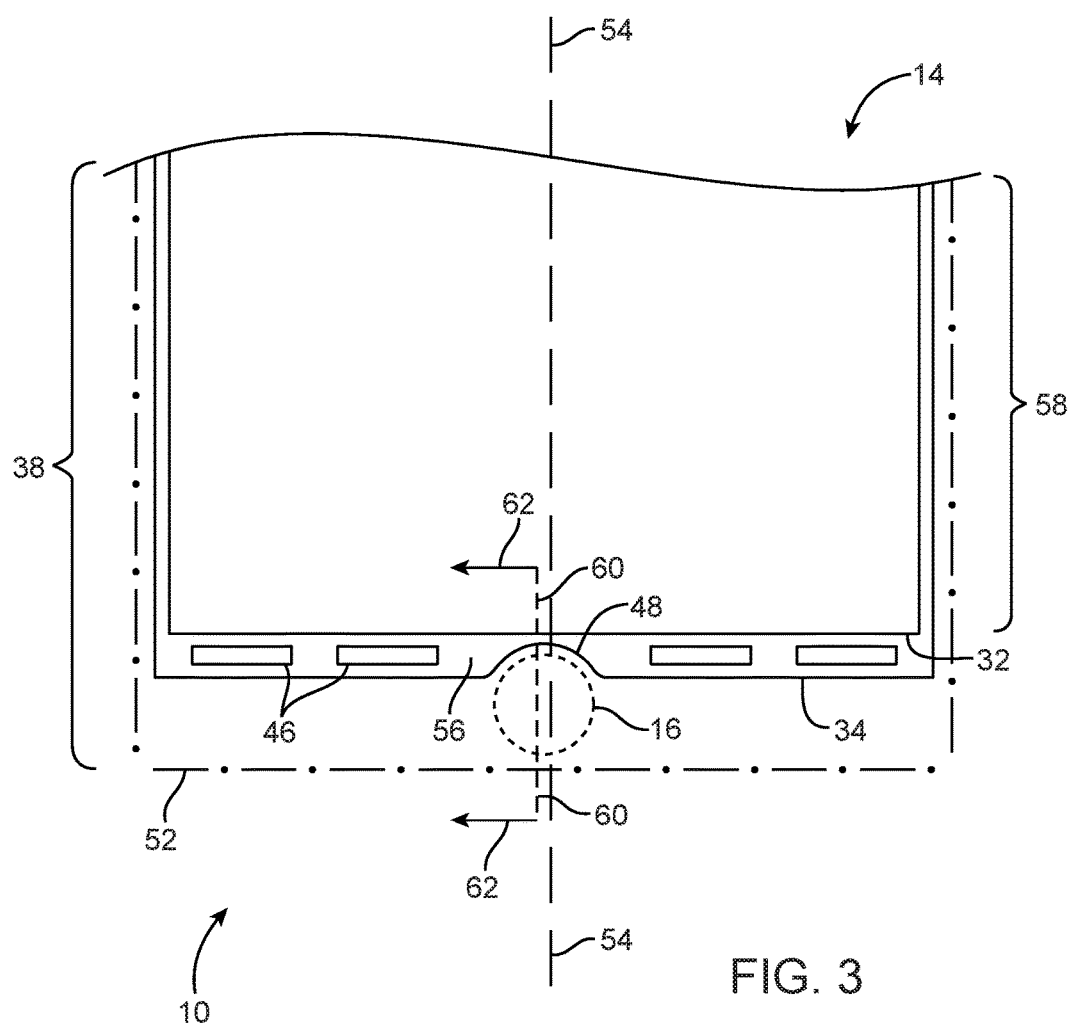
FIG. 3 is a top view of a display having a display layer such as a thin-film transistor layer with a notched shape in accordance with an embodiment of the present invention.

FIG. 3 is a top view of an illustrative configuration that may be used for display structures in display 14 of device 10 of FIG. 1. As shown in FIG. 3, display 14 may include layers 38 such as color filter layer 32 and thin-film transistor layer 34. An upper polarizer layer such as layer 20 of FIG. 2 may be attached to the exposed (outer) surface of color filter layer 34. Color filter layer 32 and thin-film transistor layer 34 may have elongated rectangular shapes extending along longitudinal axis 54. Color filter layer 32 may overlap portion 58 of thin-film-transistor layer 34, leaving thin-film-transistor driver ledge 56 exposed and uncovered by color filter layer 32. If desired, components 46 such as one or more integrated circuits may be mounted on thin-film-transistor driver ledge 56. Components 46 may be, for example, display driver integrated circuits.

Display 14 may have a display cover layer such as a layer of glass or plastic. The display cover layer for display 14 and surrounding housing structures in device 10 may have an outline such as outline 52 of FIG. 3. To accommodate components such as button 16 of FIG. 3 and structures associated with button 16 (e.g., a button gasket, etc.), display driver ledge 56 may be provided with a recess such as notch 48. Notch 48 may have a curved edge, straight edges, combinations of curved and straight edges, or other suitable shapes. The edges of notch 48 may smoothly transition into the edge of thin-film-transistor layer 34 or may form right angles or other angles with respect to the edge of thin-film-transistor layer 34. Notch 48 may have a size suitable for receiving part of a button (and/or part of a set of associated button structures) as shown in FIG. 3 or may have an area that is large enough to accommodate an entire component (e.g., all of a button such as button 16).

Figure 4:
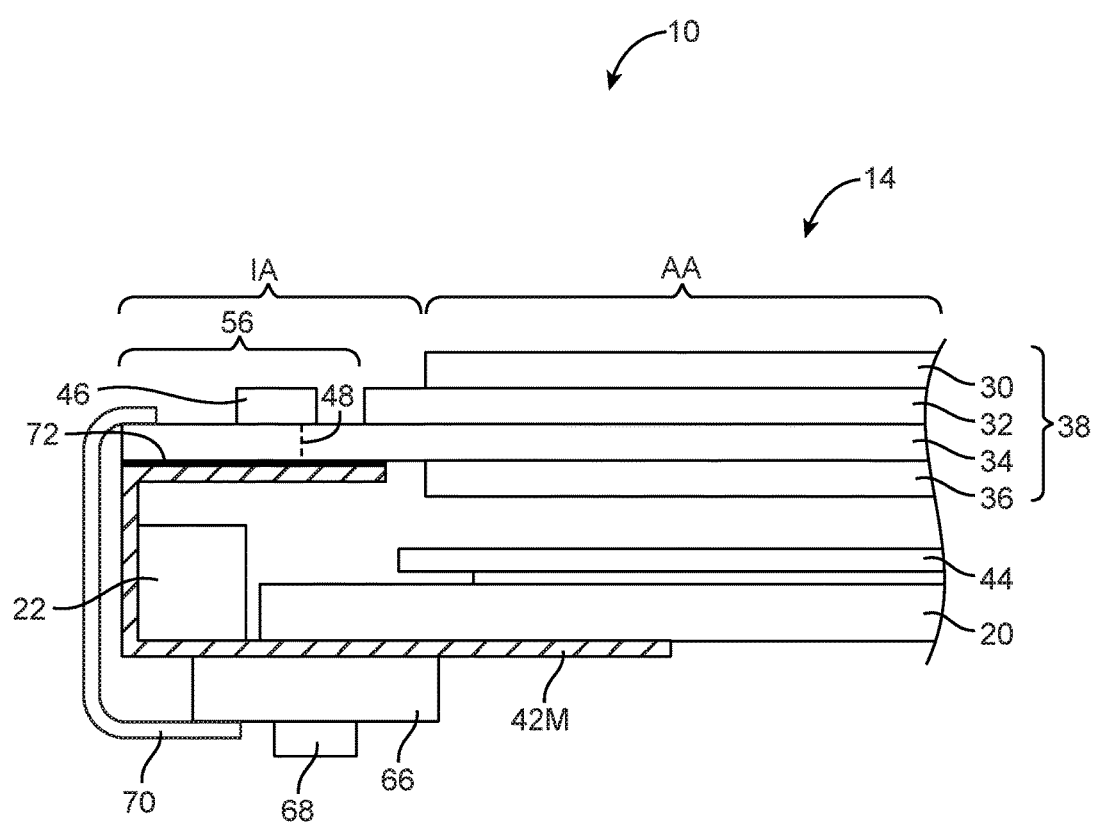
FIG. 4 is a cross-sectional side view of an illustrative display having a notched display layer such as a notched thin-film transistor layer in accordance with an embodiment of the present invention.

FIG. 4 is a cross-sectional side view of display 14 taken along line 60 of FIG. 3 and viewed in direction 62. As shown in FIG. 4, display 14 may have an active area such as active area AA and an inactive area such as inactive area IA. A display cover layer (not shown in FIG. 4) may be mounted over active area AA and inactive area IA to protect display layers 38 during operation in device 10. The underside of the display cover layer in inactive area IA may be provided with an opaque masking layer such as a layer of black ink to help hide internal component in device 10 such as the components of display 14 in inactive area IA from view by a user of device 10.

Display driver integrated circuit 46 may be mounted on driver ledge 56 of thin-film-transistor layer 34. A communications path such as flexible printed circuit cable 70 may have one end that is attached to conductive traces on ledge 56 and may have an opposing end that is attached to a substrate such as printed circuit board 66. Attachment structures such as anisotropic conductive film structures, solder bonds, welds, connectors, or other mechanisms may be used in attaching cable 70 to thin-film-transistor layer 34 and printed circuit board 66. One or more integrated circuits or other components such as display timing chips, connectors, etc. (shown as components 68 in FIG. 4) may be mounted on printed circuit board 66.

As shown in FIG. 4, display structures such as light source 22, backlight structures 20, optical films 44, and display layers 38 may be supported using a chassis structure such as chassis structure 42M. Chassis structure 42M may be attached to thin-film-transistor layer 34 using optional adhesive layer 72. Structure 42M may be, for example, a metal chassis structure formed from a layer of sheet metal that is bent to form a C-shaped cross-sectional shape. Plastic chassis structures (e.g., injection molded plastic chassis structures) may also be used in forming support structures for display 14, if desired.

When notch 48 is formed in a thin-film-transistor layer 34, there is a potential for localized weakening of thin-film-transistor layer 34. As shown in FIG. 4, metal chassis structure 42M may be attached to thin-film-transistor layer 34 in a location that overlaps notch 48, thereby strengthening thin-film-transistor layer 34 in the vicinity of notch 48. Metal chassis 42M may be formed from a metal such as stainless steel, a copper alloy, or other metals. If desired, a support structure such as chassis 42M may be formed from plastic, glass, ceramic, carbon-fiber composites or other fiber-based materials, metal, other suitable materials, or combinations of these materials. The use of metal chassis structure 42M to provide structural support for thin-film-transistor layer 32 in the vicinity of notch 48 is merely illustrative.

Figure 5:
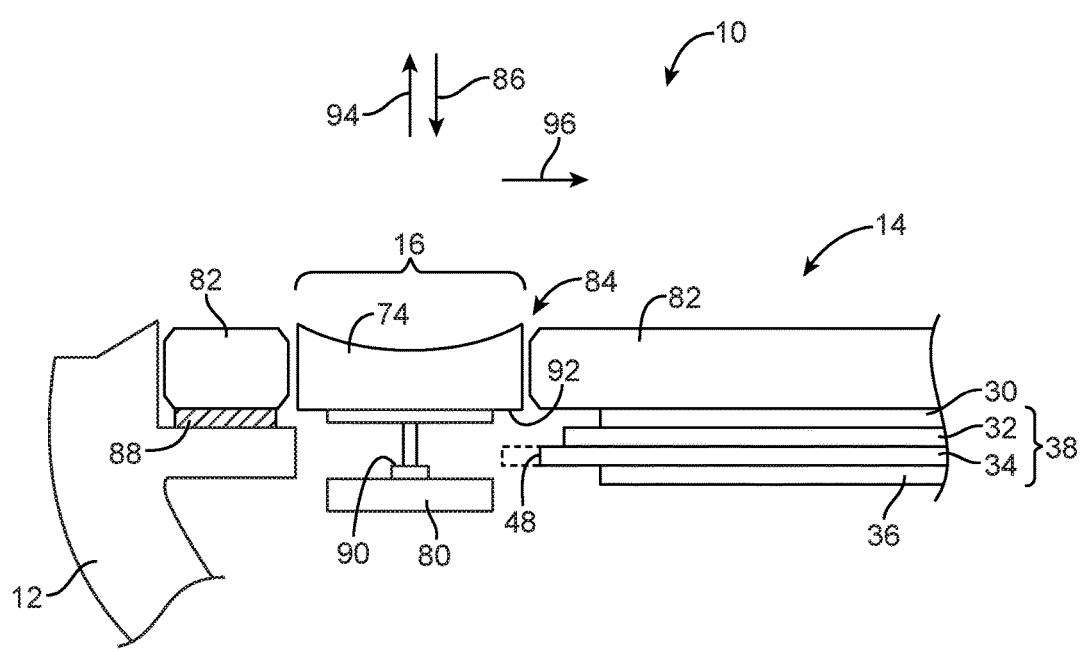
FIG. 5 is a cross-sectional side view of an electronic device taken through a button structure and a notched portion of a thin-film transistor layer and other display layers in accordance with an embodiment of the present invention.

Due to the presence of notch 48 in thin-film-transistor layer 34, button 16 may be moved further inboard (away from the periphery of device 10) without interfering with display 14 than would otherwise be possible. A cross-sectional side view of device 10 in the vicinity of button 16 (i.e., a cross-sectional side view of device 10 of FIG. 2 taken along line 60 and viewed in direction 62) is shown in FIG. 5. As shown in FIG. 5, button 16 may have an associated button member such as button member 74. Button member 74 may have a circular shape or other suitable shape and may be configured to move up in direction 94 and down in direction 86. Display cover layer 82 may be formed from a clear plastic or glass layer and may be used in covering the exposed surface of display layers 38. Adhesive 88 may be used in attaching display cover layer 82 to device housing 12.

Button 16 may have a support structure (stiffener) such as support structure 80. Switch 90 may be mounted on support structure 80. When a user presses downwards on button member 74 in direction 86, switch 90 may change its state (e.g., to close). There is a potential for portions of button member 74 to contact internal device structures such as display layers 38. In a configuration of the type shown in FIG. 5, however, in which thin-film-transistor layer 34 includes notch 48, some of the material of thin-film-transistor layer 34 has been removed and will therefore not interfere with the travel of button member 74, even when portion 92 of button member 74 moves downwards in direction 86 in response to user downwards pressure on the surface of button member 74. The presence of notch 48 allows button member 74 (and therefore button 16) to be moved more in direction 96 than would otherwise be possible, thereby minimizing the size of device 10 along longitudinal dimension 54 (FIG. 3).

Figure 6:
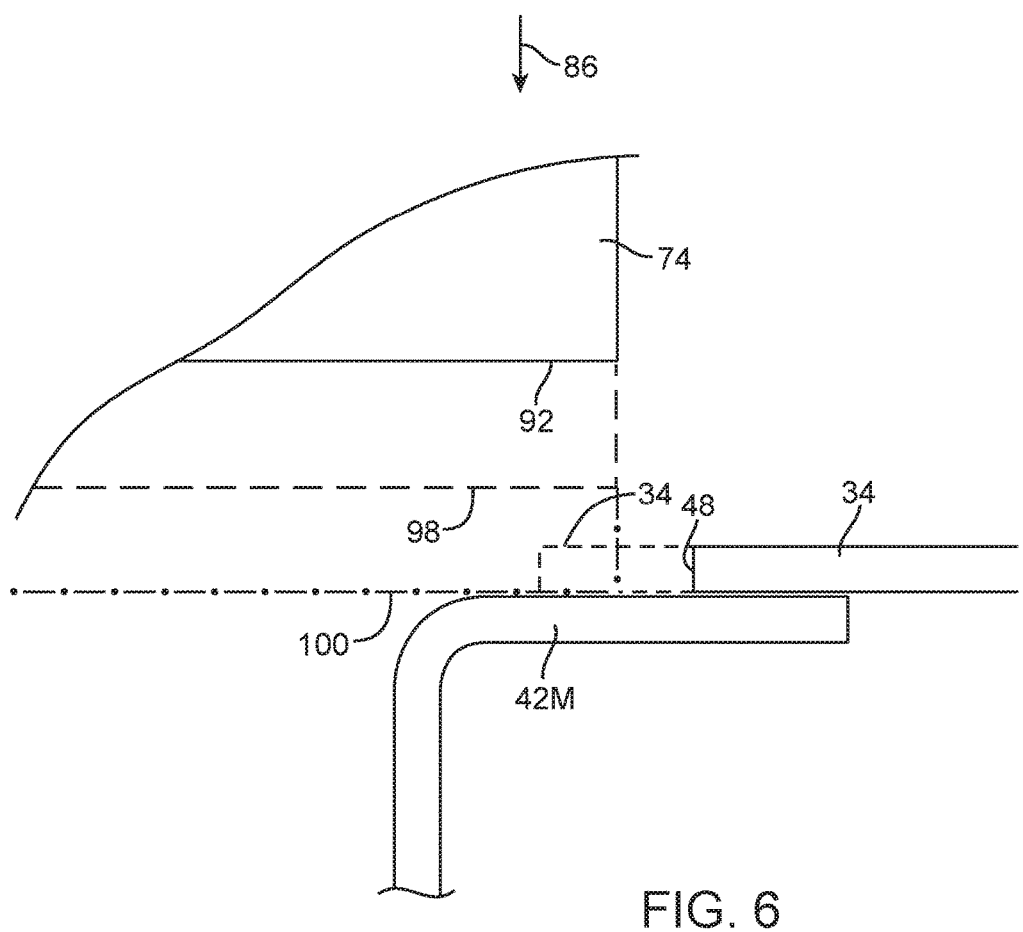
FIG. 6 is a diagram showing how over-travel of a button of the type shown in FIG. 5 may result in contact between the button and a display chassis without striking a thin-film-transistor layer in accordance with an embodiment of the present invention.

As shown in more detail in the cross-sectional side view of FIG. 6, button member 74 may nominally travel no farther into device 10 than is represented by button outline 98. In some situations, however, there is a possibility that button member 74 may travel farther (e.g., to the location represented by outline 100). In over-travel conditions such as these, lower surface 92 of button member 74 has the potential to contact internal device structures such as chassis member 42M or other display structures. Chassis member 42M may be formed from a durable material such as metal and may be configured to withstand damage in the event of occasional impacts from button member 74 of button 16. The location of notch 48 is preferably configured such that no portion of thin-film-transistor layer 34 will be struck by lower portion 92 of button member 74, even if button member 74 experiences over-travel.

Figure 7:
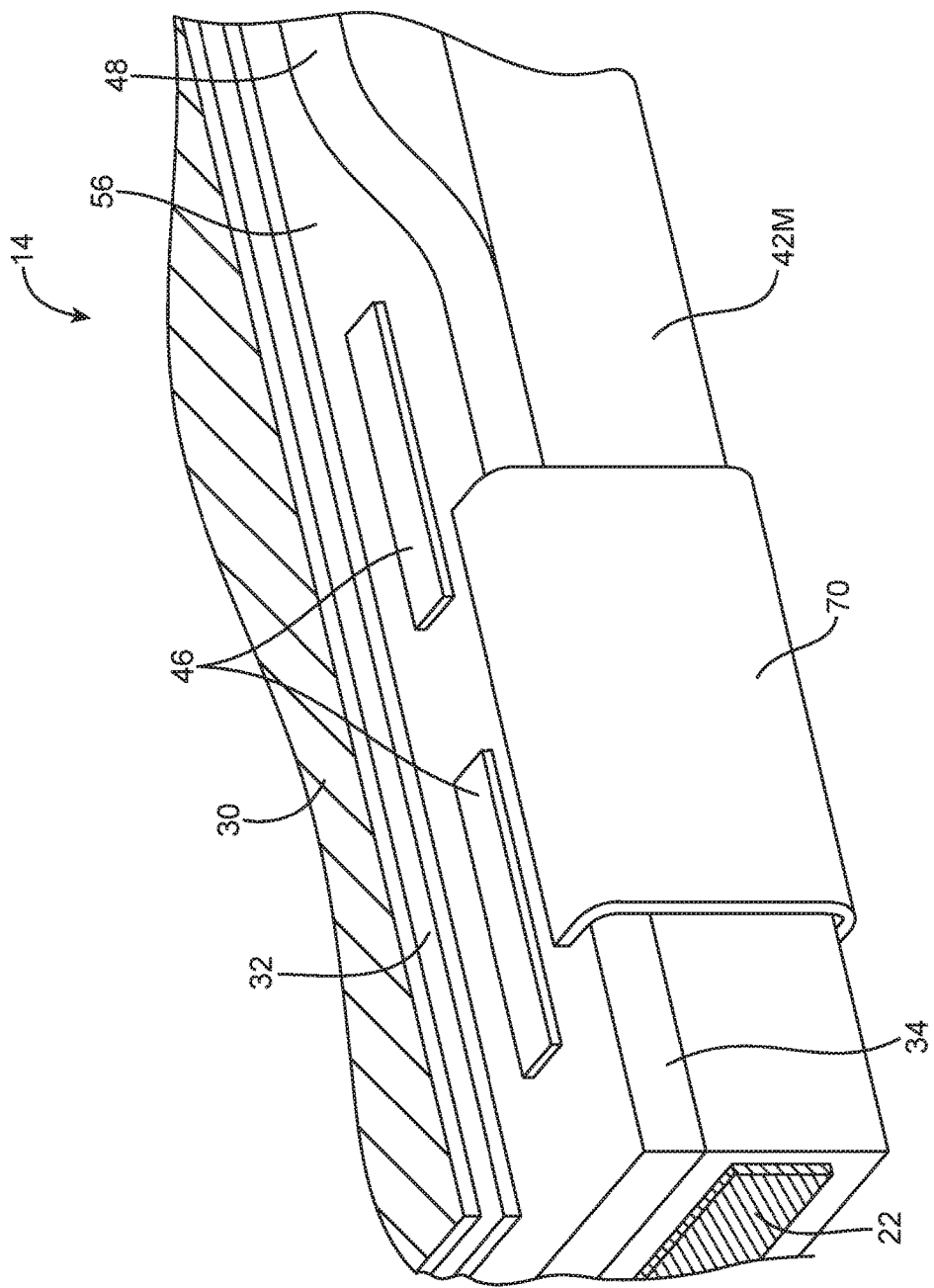
FIG. 7 is a perspective view of an illustrative electronic device having a notched display layer such as a notched thin-film transistor layer in accordance with an embodiment of the present invention.

A perspective view of the structures that make up display 14 in the vicinity of notch 48 in thin-film-transistor layer 34 is shown in FIG. 7. As shown in FIG. 7, flexible printed circuit cable 70 may wrap around thin-film-transistor layer 34 and metal display chassis structure 42M. Display chassis 42M or other support structures may overlap the area consumed by notch 48 and may therefore provide support to thin-film-transistor layer 34 in the vicinity of notch 48 to help prevent thin-film-transistor layer 34 from cracking during use of device 10.

Figure 8:
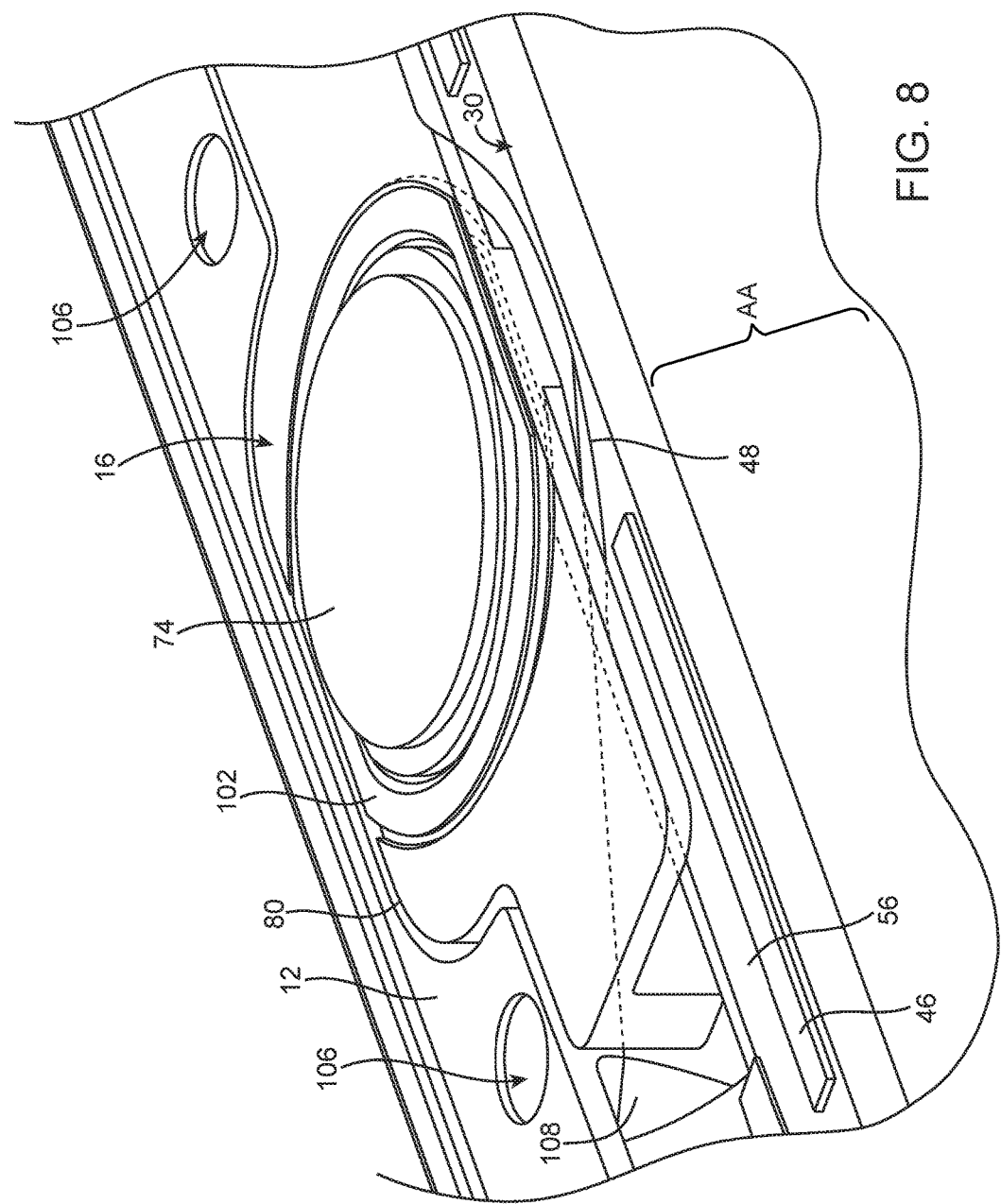
FIG. 8 is a perspective view of an illustrative electronic device having a button and a notched display layer such as a notched thin-film transistor layer with a notch that receives part of the button in accordance with an embodiment of the present invention.

FIG. 8 is a perspective view of a portion of device 10 in the vicinity of button 16. As shown in FIG. 8, button member 74 may be surrounded by an elastomeric gasket such as silicone gasket 102. Button stiffener structure 80 may surround button member 74 and gasket 102 and may have portions that support button switch 90 (see, e.g., FIG. 5). Screws 106 may be used to attach connector structure 108 to housing structure 12. The surfaces of structure 80 and housing 12 may be planar and may lie in a common plane. Display cover layer 82 may be attached to the surfaces of structure 80 and housing 12 using a layer of adhesive or other suitable fastening mechanisms.

Figure 9:
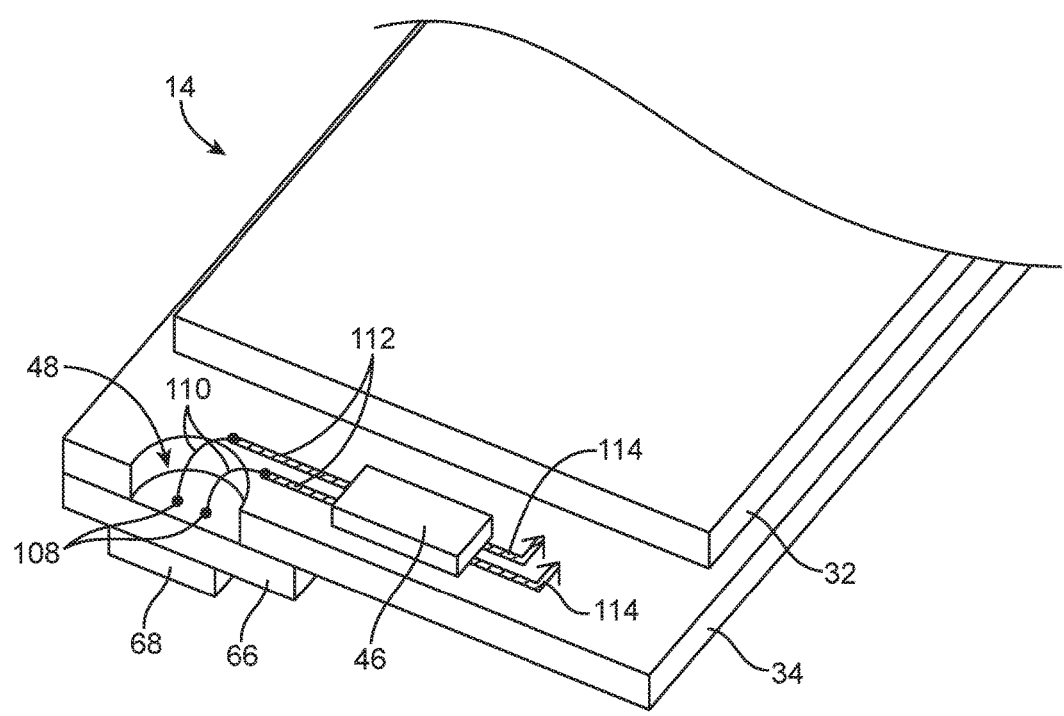
FIG. 9 is a perspective view of a portion of a display in which wire bonding wires pass through a notch in a display layer such as a thin-film-transistor layer in accordance with an embodiment of the present invention.

If desired, openings in thin-film transistor layer 34 may be used to accommodate housing structures, communications paths with conductive lines (e.g., digital buses and/or paths for analog signals), electrical components, and other structures in device 10. FIG. 9 is a perspective view of display 14 in a configuration in which thin-film-transistor layer 34 has a notch that is used to accommodate a signal path. As shown in FIG. 9, thin-film-transistor layer 34 may include notch 48. Notch 48 may overlap underlying structures such as printed circuit board 66. Printed circuit board 66 may be a rigid printed circuit board or a flexible printed circuit. One or more components such as component 68 may be mounted on printed circuit 66. If desired, components such as component 68 of FIG. 9 may be mounted on other substrates. For example, the component mounting functions of printed circuit 66 may be performed using a dielectric carrier such as an injection molded plastic carrier or other dielectric substrate.

Components such as component 68 may include one or more integrated circuits such as display timing circuits, display driver integrated circuits, application-specific integrated circuits, or other electronic components and may be mounted on the exposed lower surface of printed circuit board 66 facing downwards (in the orientation of FIG. 9). The opposing upper surface of printed circuit 66 (i.e., the exposed upper surface of printed circuit 66 in the orientation of FIG. 9) may be provided with bond pads 108. One or more bond wires such as wire bonding wires 110 may be bonded between bond pads 108 and conductive traces 112 on thin-film transistor layer 34.

Printed circuit 66 may include internal traces (e.g., interconnects and vias) that interconnect the circuitry of components 68 to bond pads 108. Wires 110 and conductive traces 112 may be electrically coupled between bond pads 108 and display driver circuitry 46 (e.g., one or more display driver integrated circuits) and may be used in routing signals between components 68 and display driver circuitry 46. Traces 114 may be used to couple display driver integrated circuits such as integrated circuit 46 to gate driver circuitry and other display control circuitry for controlling an array of display pixels in display 14.

In the example of FIG. 9, the signal path that passes through notch 48 is shown as including two wire bond wires 110. This is merely illustrative. One wire bond, two wire bonds, three wire bonds, or four or more wire bonds may be formed in notch 48 if desired. The signals that are carried on the conductive lines passing through notch 48 may include analog signals, digital signals, display data signals, control signals, clock signals, or any other suitable signals. Wires, cables, or other suitable conductive lines may be used in conveying information through notch 48. As shown in the illustrative configuration of FIG. 10, for example, a flex circuit cable such as flexible printed circuit 116 may pass through notch 48. Flexible printed circuit cable 116 may include one or more, two or more, three or more, or ten or more conductive lines (e.g., for forming a display bus or other signal bus).

Figure 10:
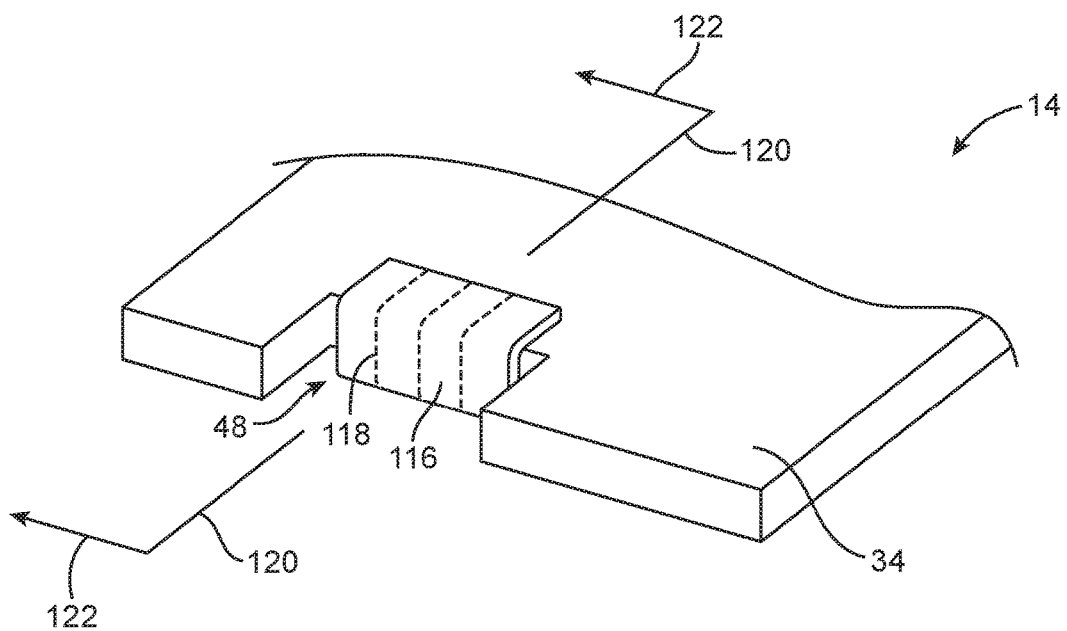
FIG. 10 is a perspective view of a portion of a display layer having a notch through which a communications path such as a flexible printed circuit with signal lines may pass in accordance with an embodiment of the present invention.

A signal path such as the signal path of FIG. 10 that has been formed from conductive traces on a flexible printed circuit substrate may be used to couple circuitry on a printed circuit board (e.g., circuitry on a main logic board or other printed circuit) to display driver circuitry such as display driver integrated circuit 46 of FIG. 9. If desired, signals can be conveyed through notch 48 using one or more discrete wires (e.g., dielectric coated metal wires), coaxial cables, flexible printed circuit transmission lines, or other conductive paths.

Figure 11:
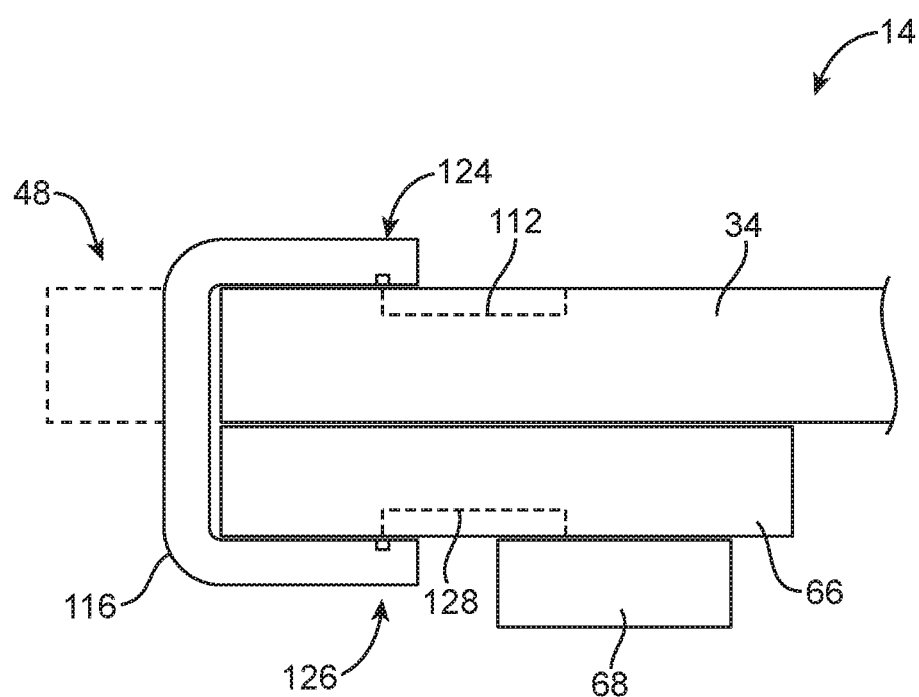
FIG. 11 is a cross-sectional side view of a portion of a display with a display layer and an associated printed circuit around which a flexible printed circuit has been wrapped in accordance with an embodiment of the present invention.

FIG. 11 is a side view of the structures of FIG. 10 taken along line 120 and viewed in direction 122. As shown in FIG. 11, flexible printed circuit cable 116 may extend through notch 48 from the upper surface of thin-film-transistor layer 34 to printed circuit 66 or other structures mounted under layer 34. Flexible printed circuit cable 116 may have one end such as end 124 that has conductive lines coupled to traces 112 on the surface of thin-film-transistor layer 34 (e.g., using anisotropic conductive film or other suitable attachment mechanisms). Flexible printed circuit cable 116 may also have an opposing end such as end 126 that is electrically coupled to traces 128 in printed circuit 66. Traces 128 in printed circuit 66 may be used to electrically couple flexible printed circuit cable 116 to integrated circuit 68.

If desired, cables such as flexible printed circuit cable 116 may be coupled to a logic board that is not mounted on thin-film-transistor layer 34 or other display layers. For example, cables or other signal paths that at least partly pass through a notch such as notch 48 of FIG. 11 or other openings in a display layer may be used in coupling thin-film-transistor circuitry on thin-film-transistor layer 34 (e.g., display driver circuitry in an integrated circuit, display driver circuitry formed as a thin-film-transistor circuit on layer 34, etc.) to other circuitry in device 10 such as circuitry 68 on printed circuit 66 of FIG. 11, circuitry on a motherboard, circuitry on a daughter board, circuitry on one or more other printed circuits, circuitry on support structures formed from injection-molded plastic or other dielectrics, structures formed from flexible printed circuits, etc.

Figure 12:
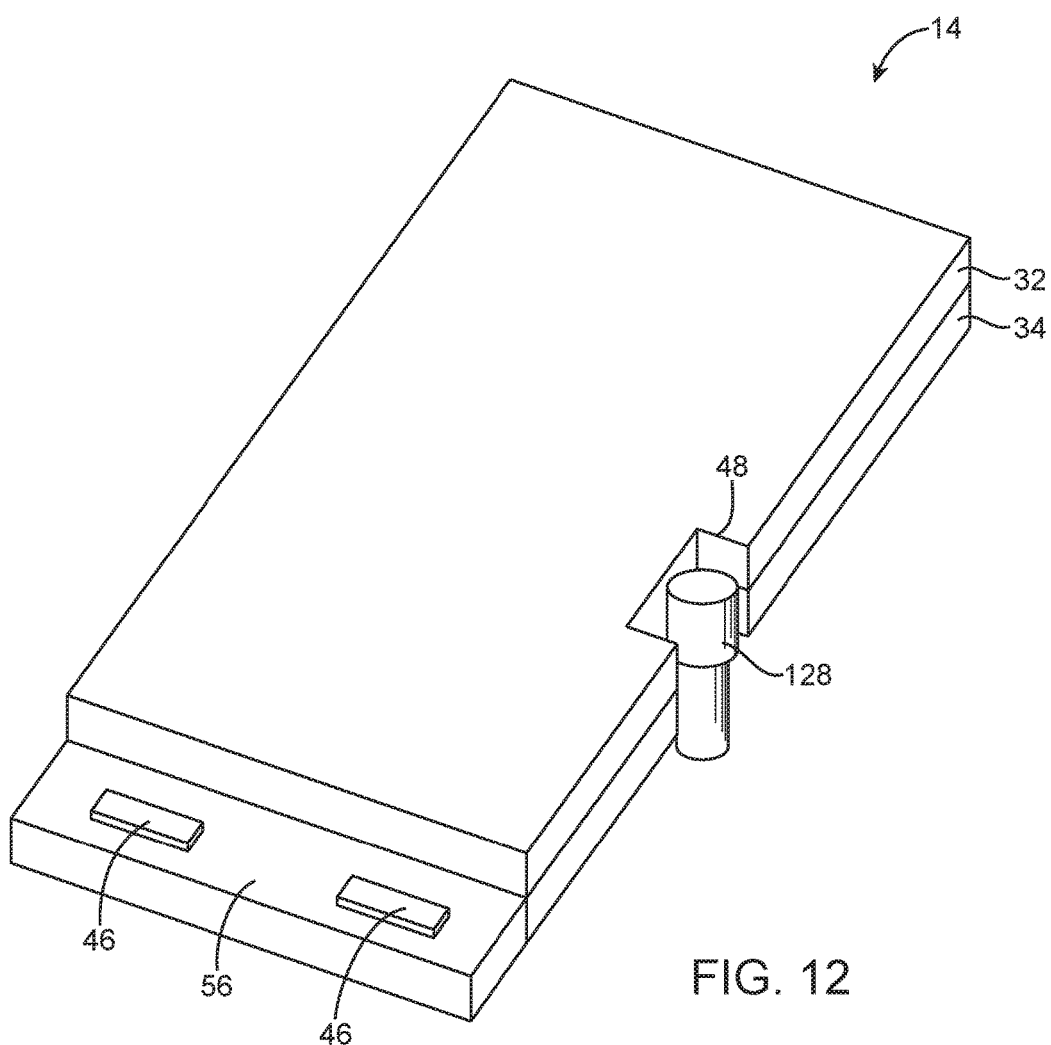
FIG. 12 is a perspective view of a portion of a display showing how display layers may be provided with overlapping notch features in accordance with an embodiment of the present invention.

Notches such as notch 48 may, if desired, pass through multiple display layers in display 14. As shown in FIG. 12, for example, notch 48 may be formed from a recess in color filter layer 32 and an aligned recess in thin-film-transistor layer 34. The sizes and the shapes of the notches in layers 32 and 34 may be identical or may overlap to create a notch having an area defined by the overlap region between layers 32 and 34. In configurations in which a cable, button, other component, or other device structure is passing through the notch, the sizes and shapes of the notch regions in layers 32 and 34 may overlap sufficiently to create a common notch region. As shown in the configuration of FIG. 12, the size and shape of notch 48 may be common to both layers 32 and 34. If desired, display layers such as polarizer layers 30 and 36 may be provided with notches that match the notches in layers 32 and 34. Notches or other openings that overlap with notch regions in layers 32 and 34 may also be provided in layers such as display cover layer 82 and touch sensor layer 40.

Notches in display 14 (e.g., in display layers 38) may be configured to receive any suitable structures such as structures 128 in FIG. 12. Structures 128 may include housing structures such as screws, frame members, housing walls, screw bosses, internal housing structures, and other structural members. The presence of one or more openings in display layers 38 such as layers 32 and/or 34 that are configured to receive housing structures such as these may allow device 10 to be implemented more compactly than would otherwise be possible. Notches such as notch 48 may also be configured to receive electrical components (i.e., structure 128 may include one or more components). As an example, electrical components 128 such as image sensors, cameras (e.g., camera modules that include image sensors and lenses), light-based proximity sensors or other proximity sensors, ambient light sensors, connectors, switches, buttons, speakers, microphones, and other audio components, audio jacks, removable media structures, buttons, audio components, integrated circuits, printed circuits, cables or other communications paths, or other structures may be mounted in device 10 so that at least some of the structures are received within notch 48.

Figure 13:
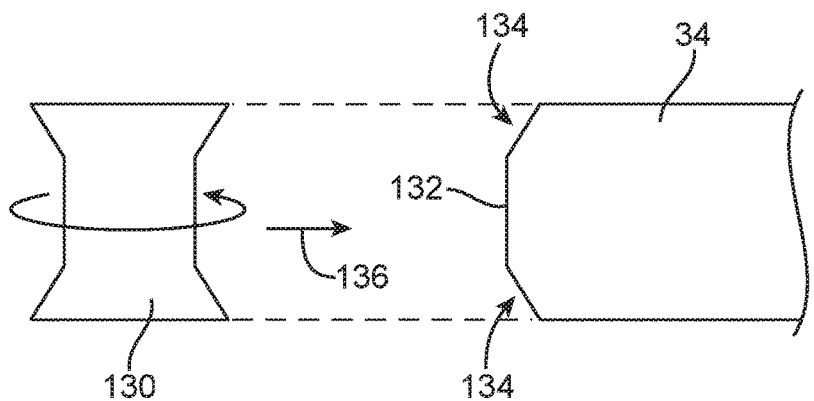
FIG. 13 is a cross-sectional side view of a machining tool being used to form chamfers within a notch on an edge of a display layer such as a thin-film-transistor layer in accordance with an embodiment of the present invention.
Figure 14:
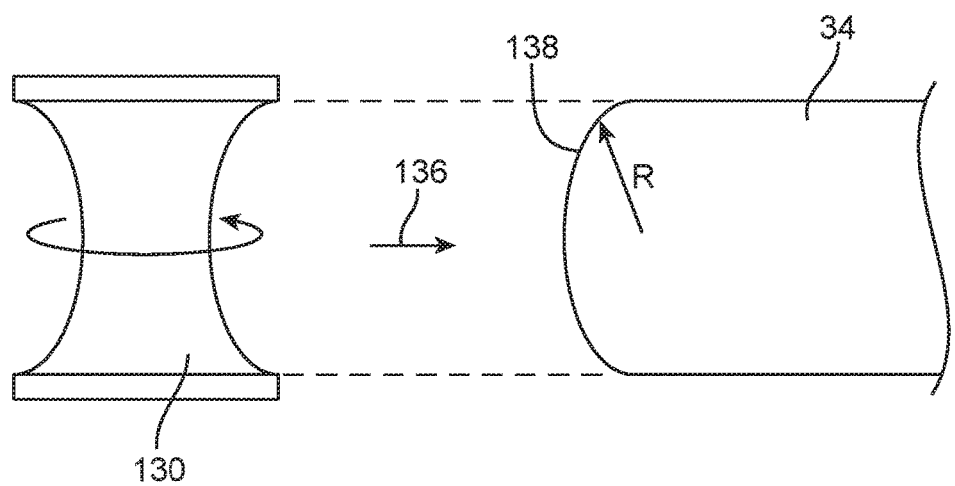
FIG. 14 is a cross-sectional side view of a machining tool being used to form a rounded edge within a notch on an edge of a display layer such as a thin-film-transistor layer in accordance with an embodiment of the present invention.

Notch 48 may be formed by water-jet cutting, scribing and breaking, machining using cutting tools, or other suitable techniques. As shown in FIGS. 13 and 14, for example, a rotating cutter such as cutter 130 may be moved towards layer 34 in direction 136 to machine or otherwise create a desired surface shape on the exposed edge of one or more layers in display 14 (e.g., layer 34 or other display layers). In the example of FIG. 13, cutter 130 has a shape for cutting a flat edge such as planar surface 132 and upper and lower beveled surfaces such as chamfers 134, resulting in a chamfered edge on thin-film-transistor layer 34 or other display layers. The shape of cutter 130 may help prevent layer 34 from vibrating up and down during the cutting process. If desired, other shapes for forming flat edges such as edge 132 on display layers such as thin-film-transistor layer 34 may be used. For example, cutter 130 may be formed from a rotating cylindrical member that forms a flat vertical leading edge on layer 34. FIG. 14 shows how cutter 130 may be configured to form rounded edge 138 on a display layer such as thin-film-transistor layer 34. Rounded edge 138 may be characterized by a radius of curvature R.

Figure 15:
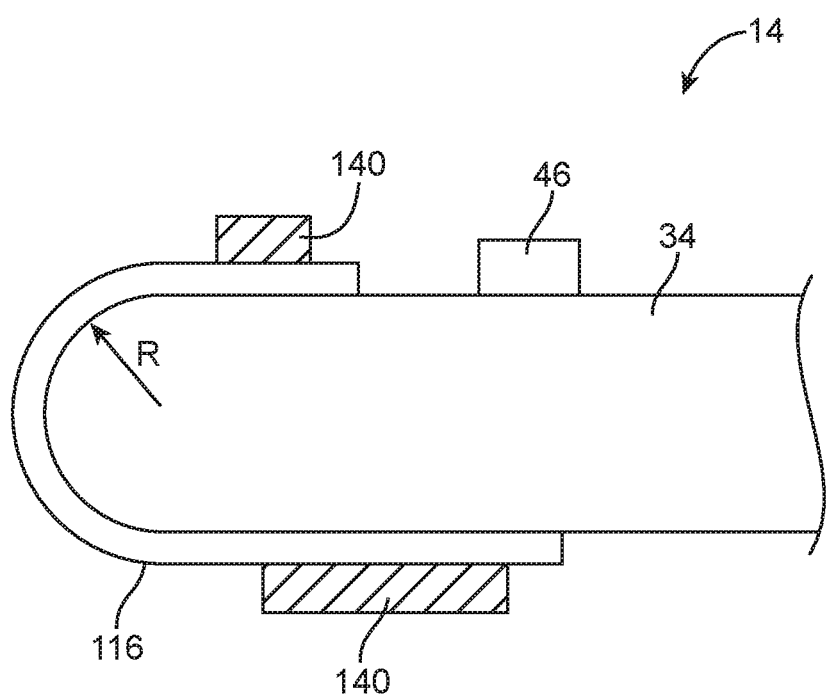
FIG. 15 is a cross-sectional side view of a rounded edge within a notch of a display layer and an associated flexible printed circuit in accordance with an embodiment of the present invention.
Figure 16:
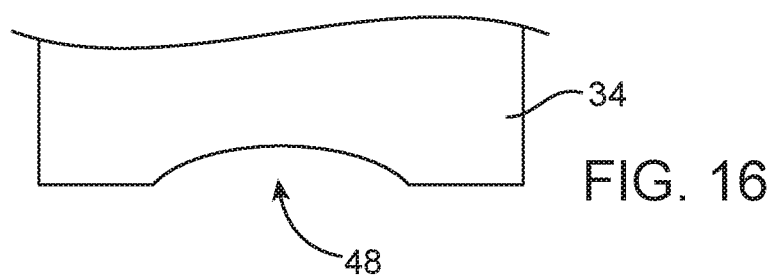
FIG. 16 is a top view of an illustrative display layer notch with a curved edge in accordance with an embodiment of the present invention.

As shown in the cross-sectional side view of FIG. 15, the magnitude of radius of curvature R may be configured to create a desired bend radius for flexible printed circuit layer 116. Layer 116 may be, for example, a strip of flexible printed circuit material that includes parallel traces for forming a signal bus that couples electrical circuitry such as circuitry in or associated with components 140 and 46.

Figure 17:
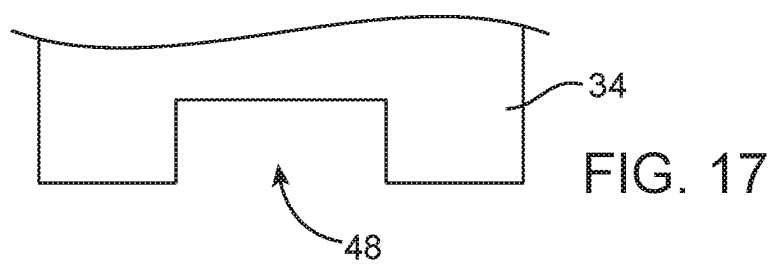
FIG. 17 is a top view of an illustrative display layer notch with straight edges in accordance with an embodiment of the present invention.
Figure 18:
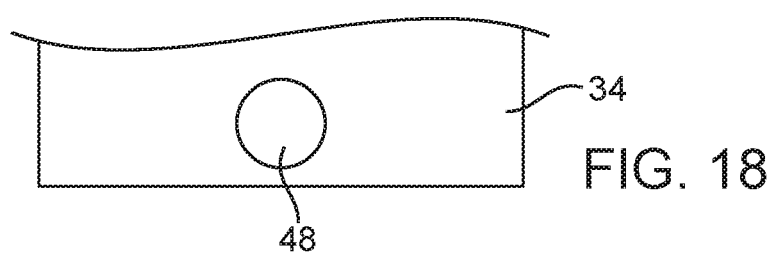
FIG. 18 is a top view of an illustrative display with a circular hole in a layer such as a thin-film-transistor layer in accordance with an embodiment of the present invention.
Figure 19:
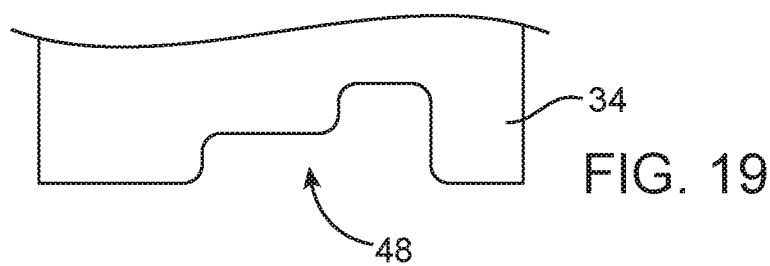
FIG. 19 is a top view of an illustrative display layer notch with portions of different depths in accordance with an embodiment of the present invention.

FIGS. 16, 17, 18, and 19 are top views of illustrative shapes that may be used in forming display layers openings. Notch 48 may have a curved edge shape, as shown in the top view of layer 34 in FIG. 16. As shown in FIG. 17, notch 48 may have straight sidewalls. If desired, an opening may be formed in display layers such as opening 48 in layer 34 of FIG. 18. FIG. 19 shows how notch 48 may have shallow portions and deeper portion.

Figure 20:
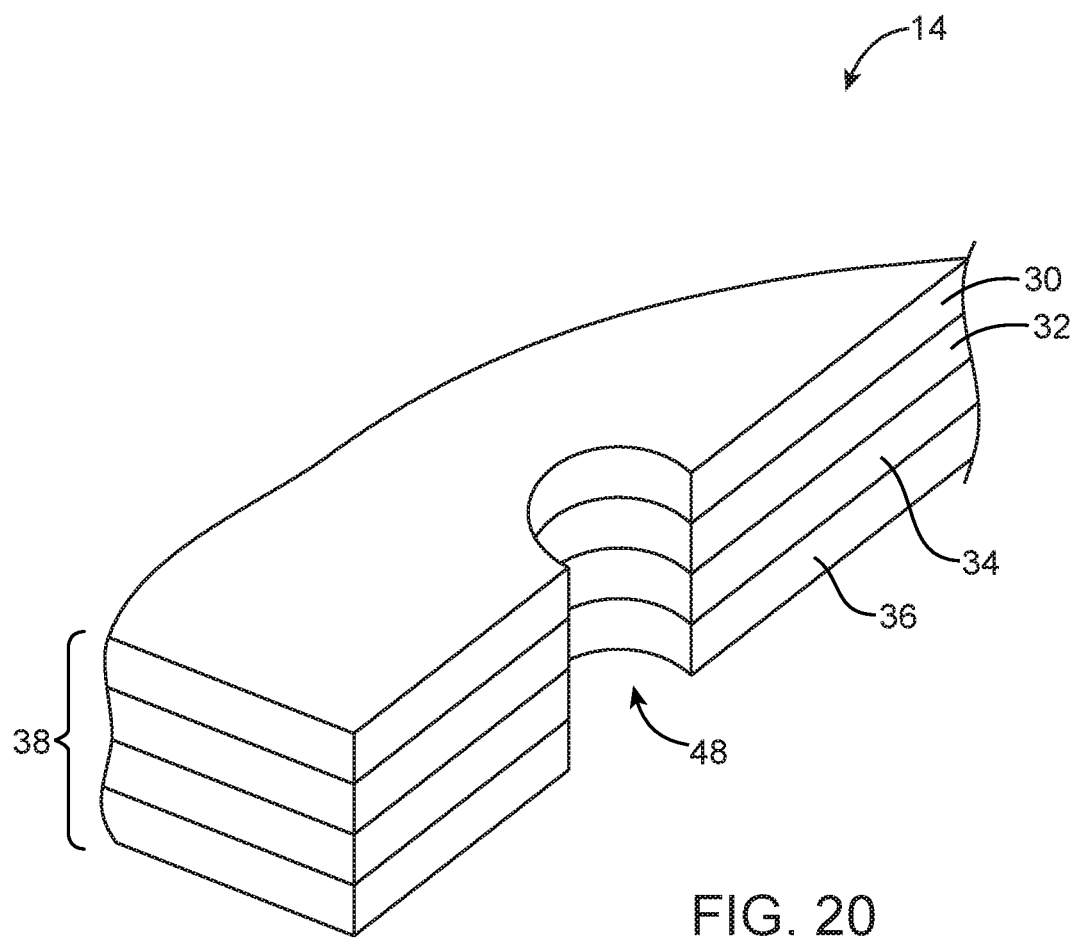
FIG. 20 is a perspective view of an illustrative display having a notch formed through multiple display layers in accordance with an embodiment of the present invention.

As shown in FIG. 20, an opening in display layers 38 such as notch 48 may pass through polarizer layers 30 and 36, color filter layer 32, and thin-film-transistor layer 34. In general, notch 48 may pass through one or more of these layers, two or more of these layers, three or more of these layers, or four or more of these layers. Configurations in which notch 48 passes through thin-film-transistor layer 34 are sometimes described herein as an example. In general, however, notch 48 may pass through any suitable number of layers in display 14 (e.g., one or more display layers, a touch sensor layer, a display cover layer, etc.).

Figure 21:
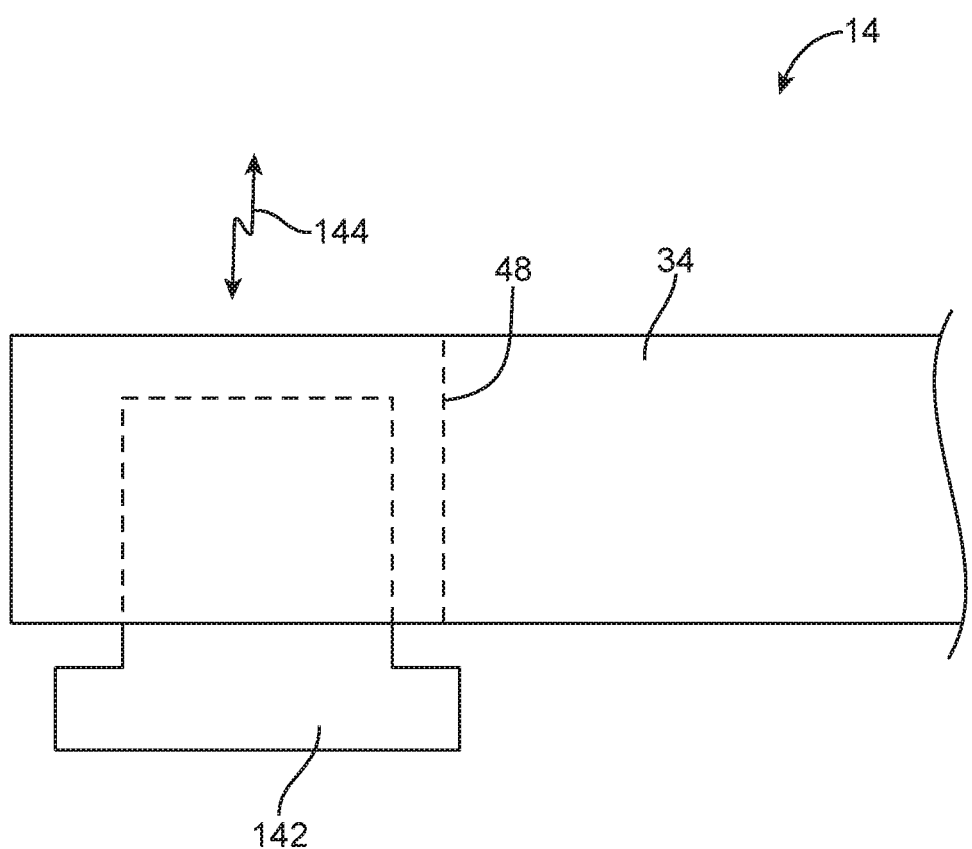
FIG. 21 is a cross-sectional side view of a display in which an electrical component that handles signals is received within a notch in a display layers such as a thin-film-transistor layer in accordance with an embodiment of the present invention.

As shown in the cross-sectional side view of layer 34 of FIG. 21, a component such as component 142 may transmit and/or receive signals such as signals 144 through the opening formed by notch 48 in a display layer such as thin-film-transistor layer 34 and/or other display layers 38. Signals 144 may be, for example, visible, infrared, or ultraviolet transmitted light and/or received light, transmitted radio-frequency electromagnetic signals or other transmitted electromagnetic signals, received radio-frequency electromagnetic signals or other received electromagnetic signals, acoustic signals (ultrasonic or audible sound), or other signals. Opening 48 may be a circular hole, a recessed opening such as a notch, or other opening in a display layer in display 14. Component 142 may be an image sensor, a proximity sensor, an ambient light sensor, a status indicator light, a touch sensor, a light-emitting diode, a speaker, a microphone, other audio circuitry, an integrated circuit, a button, a connector, a housing structure, an integrated circuit, a printed circuit, a cable, wires, other structures in device 10, combinations of these structures, or portions of these structures.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
    a display comprising display circuitry formed on a display layer, wherein the display layer has a first edge;
    a notch in the first edge of the display layer, wherein the notch forms a second edge of the display layer that is recessed relative to the first edge, and wherein the display circuitry is formed on opposing sides of the notch;
    a first sensor in the notch; and
    a second sensor in the notch, wherein the notch at least partially surrounds the first and second sensors.

2. The electronic device defined in claim 1, wherein the notch forms rounded edges of the display layer between the first and second straight edges.

3. The electronic device defined in claim 2, wherein the display has an active area with a pair of opposing long edges and a pair of opposing short edges, and wherein the first edge of the display layer runs along one of the short edges of the active area.

4. The electronic device defined in claim 1, wherein the first sensor is an ambient light sensor and the second sensor is a proximity sensor.

5. The electronic device defined in claim 4, further comprising:
    a camera in the notch;
    a light-emitting component in the notch; and
    a speaker in the notch, wherein the notch at least partially surrounds the camera, the light-emitting component, and the speaker.

6. The electronic device defined in claim 5, further comprising:
    an additional camera in the notch; and
    an additional light-emitting component in the notch, wherein the notch at least partially surrounds the additional camera and the additional light-emitting component.

7. The electronic device defined in claim 1, wherein the display is an organic light-emitting diode display.

8. An electronic device having a front surface, a rear surface, and sidewall surfaces, the electronic device comprising:
    a housing having a planar dielectric portion that forms the rear surface and a metal portion that forms the sidewall surfaces;
    a display mounted in the housing, wherein the display forms the front surface, wherein the display has a perimeter with a first straight edge and a notch in the first straight edge, wherein the notch defines a second straight edge of the perimeter and curved edges of the perimeter;
    a light-sensing component in the notch;
    a light-emitting component in the notch; and
    an audio component in the notch.

9. The electronic device defined in claim 8, where the display comprises organic light-emitting diode pixels.

10. The electronic device defined in claim 9, wherein the display comprises a polarizer, and wherein a portion of the polarizer is removed in the notch.

11. The electronic device defined in claim 9, further comprising:
    a touch sensor that overlaps the display, wherein the touch sensor comprises a notch-shaped recess that overlaps the notch in the display.

12. The electronic device defined in claim 9, further comprising:
a transparent display cover layer that overlaps the display and the notch.

13. The electronic device defined in claim 9, wherein the light-sensing component is an ambient light sensor, the light-emitting component is a proximity sensor, and the audio component is a speaker.

14. The electronic device defined in claim 13, further comprising:
a camera in the notch; and
an additional light-emitting component in the notch.

15. An electronic device, comprising:
a display having an active area with pixels that emit light;
a notch in the active area that is free of pixels, wherein the active area surrounds opposing sides of the notch;
a light-emitting component in the notch;
a light-sensing component in the notch; and
an audio component in the notch, wherein the notch at least partially surrounds the light-emitting component, the light-sensing component, and the audio component.

16. The electronic device defined in claim 15, wherein notch has a straight edge and a curved edge.

17. The electronic device defined in claim 15, further comprising:
a housing having a dielectric portion that forms a rear surface of the electronic device and a metal portion that forms sidewall portions of the electronic device, wherein the display is mounted in the housing and forms a front surface of the electronic device; and
a transparent display cover layer that overlaps the display.

18. The electronic device defined in claim 15, wherein the display comprises a polarizer that overlaps the active area, and wherein at least a portion of the notch is free of the polarizer.

19. The electronic device defined in claim 15, wherein the light-emitting component is an infrared light emitter, the light-sensing component is a camera, and the audio component is a microphone.

20. The electronic device defined in claim 19, further comprising:
a proximity sensor in the notch;
an ambient light sensor in the notch; and
a speaker in the notch, wherein the notch at least partially surrounds the proximity sensor, the ambient light sensor, and the speaker.

21. An electronic device, comprising:
an organic light-emitting diode display having a perimeter with a pair of opposing short edges and a pair of opposing long edges, wherein one of the short edges has a notch-shaped recess with a lower edge that runs parallel to the opposing short edges and opposing left and right edges that run parallel to the opposing long edges, and wherein the organic light-emitting diode display comprises display circuitry formed along the left and right edges of the notch-shaped recess; and
electrical components received in the notch-shaped recess, wherein the electrical components transmit infrared light through the notch-shaped recess and receive infrared light through the notch-shaped recess.

22. The electronic device defined in claim 21, further comprising:
a camera received in the notch-shaped recess, wherein the camera receives light through the notch-shaped recess; and
an ambient light sensor received in the notch-shaped recess, wherein the ambient light sensor receives light through the notch-shaped recess.

23. The electronic device defined in claim 21, further comprising:
a touch sensor that overlaps the organic light-emitting diode display, wherein the touch sensor has an additional notch-shaped recess that is aligned with the notch-shaped recess in the organic light-emitting diode display.

24. The electronic device defined in claim 21, wherein the notch-shaped recess has a first curved edge that runs between the left edge and the lower edge and a second curved edge that runs between the lower edge and the right edge.

* * * * *